(12) United States Patent
Sakoda et al.

(10) Patent No.: US 12,255,215 B2
(45) Date of Patent: Mar. 18, 2025

(54) IMAGING ELEMENT AND IMAGING DEVICE

(71) Applicant: SONY SEMICONDUCTOR SOLUTIONS CORPORATION, Kanagawa (JP)

(72) Inventors: Kazuki Sakoda, Kumamoto (JP); Yusuke Uesaka, Kanagawa (JP); Susumu Inoue, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 391 days.

(21) Appl. No.: 17/753,599

(22) PCT Filed: Jul. 16, 2020

(86) PCT No.: PCT/JP2020/027703
§ 371 (c)(1),
(2) Date: Mar. 9, 2022

(87) PCT Pub. No.: WO2021/053952
PCT Pub. Date: Mar. 25, 2021

(65) Prior Publication Data
US 2022/0336512 A1 Oct. 20, 2022

(30) Foreign Application Priority Data
Sep. 17, 2019 (JP) ................. 2019-168138

(51) Int. Cl.
*H01L 27/146* (2006.01)
(52) U.S. Cl.
CPC .... *H01L 27/14625* (2013.01); *H01L 27/1461* (2013.01); *H01L 27/14621* (2013.01); *H01L 27/14623* (2013.01)

(58) Field of Classification Search
CPC .......... H01L 27/14625; H01L 27/1461; H01L 27/14621; H01L 27/14623; H01L 27/146;
(Continued)

(56) References Cited

U.S. PATENT DOCUMENTS

2007/0272829 A1* 11/2007 Nakagawa ........ H01L 27/14625
438/48
2015/0228684 A1 8/2015 Yamashita
(Continued)

FOREIGN PATENT DOCUMENTS

CN 104835826 A 8/2015
CN 107924923 A 4/2018
(Continued)

OTHER PUBLICATIONS

International Search Report and Written Opinion of PCT Application No. PCT/JP2020/027703, issued on Oct. 6, 2020, 09 pages of ISRWO.

*Primary Examiner* — Douglas W Owens
(74) *Attorney, Agent, or Firm* — CHIP LAW GROUP

(57) ABSTRACT

An imaging element is provided with a plurality of pixels, a separation region, and a non-separation region. Each of the plurality of pixels is provided with a polarization unit that polarizes incident light in a specific polarization direction and a photoelectric conversion unit that is formed in a semiconductor substrate and performs photoelectric conversion of the polarized incident light. The separation region is arranged in the semiconductor substrate and separates the plurality of pixels from each other. The non-separation region includes the semiconductor substrate and is arranged in a clearance formed in the separation region in the vicinity of a corner of each of the plurality of pixels.

13 Claims, 13 Drawing Sheets

(58) Field of Classification Search
CPC ........ H04N 25/62; H04N 25/76; H04N 25/70; G02B 5/30
See application file for complete search history.

(56) References Cited

U.S. PATENT DOCUMENTS

2019/0006407 A1* 1/2019 Uesaka ............. H01L 27/14645
2021/0280617 A1* 9/2021 Sugizaki ........... H01L 27/14636

FOREIGN PATENT DOCUMENTS

| | | |
|---|---|---|
| JP | 2015-153772 A | 8/2015 |
| JP | 2019-145544 A | 8/2019 |
| KR | 10-2015-0094489 A | 8/2015 |
| TW | 201532257 A | 8/2015 |
| WO | 2017/018258 A1 | 2/2017 |
| WO | 2019/159711 A1 | 8/2019 |

* cited by examiner

IMAGING ELEMENT AND IMAGING DEVICE

CROSS REFERENCE TO RELATED APPLICATIONS

This application is a U.S. National Phase of International Patent Application No. PCT/JP2020/027703 filed on Jul. 16, 2020, which claims priority benefit of Japanese Patent Application No. JP 2019-168138 filed in the Japan Patent Office on Sep. 17, 2019. Each of the above-referenced applications is hereby incorporated herein by reference in its entirety.

TECHNICAL FIELD

The present disclosure relates to an imaging element and an imaging device. Specifically, this relates to an imaging element that acquires polarization information of a subject and an imaging device using the imaging element.

BACKGROUND ART

Conventionally, an imaging element that acquires polarization information of a subject has been used. By acquiring the polarization information, it is possible to detect incident light in a specific polarization direction, for example, reflected light from a puddle or a glass surface and the like, and remove the incident light in the specific polarization direction. It is possible to improve an image quality of an image imaged by the imaging element. Furthermore, a three-dimensional shape of a surface of the subject may also be acquired using the polarization information. The polarization information may be acquired by arranging a polarization unit that transmits the incident light in the specific polarization direction in a pixel of the imaging element. As the polarization unit, a polarization unit including a wire grid may be used. The wire grid is formed by arranging a plurality of strip-shaped conductors on the basis of a predetermined pitch. The incident light in the polarization direction parallel to an arrangement direction of the plurality of strip-shaped conductors is transmitted through the polarization unit including the wire grid, and the incident light in the polarization direction perpendicular to the arrangement direction of the plurality of strip-shaped conductors is reflected by the polarization unit and attenuated.

As such imaging element, for example, an imaging element provided with a light shielding film surrounding a periphery of a photoelectric conversion element in a semiconductor substrate in which the photoelectric conversion element for each pixel is arranged in which a polarization unit is arranged on a back surface of the semiconductor substrate is used (refer to, for example, Patent Document 1). In this imaging element, the light shielding film is arranged in a lattice pattern so as to fill a space between adjacent pixels. Furthermore, the light shielding film is connected to a strip-shaped conductor including a conductive light shielding material and forming the polarization unit, and a negative bias voltage is applied to the polarization unit via the light shielding film. By this bias voltage, negative potential is applied to the back surface of the semiconductor substrate, and pinning on a back surface side of the semiconductor substrate is strengthened.

CITATION LIST

Patent Document

Patent Document 1: International Publication No. 2017/018258

SUMMARY OF THE INVENTION

Problems to be Solved by the Invention

In the above-described conventional technology, there is a problem that crosstalk between pixels increases. The above-described light shielding film is formed by forming a lattice-shaped groove in a semiconductor substrate by etching and embedding a conductive light shielding material such as metal in the groove. When this groove is formed, a microloading phenomenon occurs at an intersection of longitudinal and lateral grooves forming the lattice, and the groove becomes deep. Therefore, the grooves other than the intersection become relatively shallow, and a depth of the formed light shielding film is insufficient. In a region of the light shielding film having an insufficient depth, there is a problem that leakage of incident light to adjacent pixels occurs and the crosstalk increases. Due to this crosstalk, an error of polarization information increases, and an image quality of an image imaged by the imaging element is deteriorated.

The present disclosure is achieved in view of the above-described problems, and an object thereof is to reduce crosstalk between adjacent pixels in an imaging element that acquires polarization information of a subject.

Solutions to Problems

The present disclosure is achieved to solve the above-described problem, and a first aspect thereof is an imaging element provided with a plurality of pixels each provided with a polarization unit that polarizes incident light in a specific polarization direction and a photoelectric conversion unit that is formed in a semiconductor substrate and performs photoelectric conversion of the polarized incident light, a separation region that is arranged in the semiconductor substrate and separates the plurality of pixels from each other, and a non-separation region including the semiconductor substrate in a clearance formed in the separation region in the vicinity of a corner of the pixels.

Furthermore, in the first aspect, the polarization unit may polarize the incident light by transmitting incident light in a specific polarization direction out of the incident light.

Furthermore, in the first aspect, the polarization unit may include a wire grid including a plurality of strip-shaped conductors arranged at a predetermined pitch.

Furthermore, in the first aspect, the non-separation region may be arranged between the plurality of pixels provided with polarization units of specific polarization directions not orthogonal to each other.

Furthermore, in the first aspect, the separation region may be formed in a recess formed in the semiconductor substrate.

Furthermore, in the first aspect, the separation region may include a member that shields the incident light.

Furthermore, in the first aspect, the separation region may include a member of metal.

Furthermore, in the first aspect, the separation region may include an insulating member.

Furthermore, in the first aspect, the non-separation region may include the semiconductor substrate in the clearance having a gap of approximately 10% of a width of a surface irradiated with the incident light of the pixel.

Furthermore, in the first aspect, the non-separation region may include the semiconductor substrate in the clearance having a gap substantially equivalent to a width of a surface irradiated with the incident light of the separation region.

Furthermore, the first aspect may be further provided with a second pixel that is the pixel not provided with the polarization unit.

Furthermore, in the first aspect, the non-separation region may be arranged between the pixel and the second pixel.

Furthermore, a second aspect of the present disclosure is an imaging device provided with a plurality of pixels each provided with a polarization unit that polarizes incident light in a specific polarization direction and a photoelectric conversion unit that is formed in a semiconductor substrate and performs photoelectric conversion of the polarized incident light, a separation region that is arranged in the semiconductor substrate and separates the plurality of pixels from each other, a non-separation region including the semiconductor substrate in a clearance formed in the separation region in the vicinity of a corner of the pixels, and a processing circuit that processes an image signal generated on the basis of the photoelectric conversion.

According to the aspects of the present disclosure, there is an effect that the non-separation region is arranged adjacent to the separation region of a region in which boundaries of the pixels intersect.

MODE FOR CARRYING OUT THE INVENTION

Next, modes for carrying out the present disclosure (hereinafter, referred to as embodiments) are described with reference to the drawings. In the following drawings, the same or similar parts are assigned with the same or similar reference signs. Furthermore, the embodiments are described in the following order.
1. First Embodiment
2. Second Embodiment
3. Third Embodiment
4. Fourth Embodiment
5. Fifth Embodiment
6. Sixth Embodiment
7. Application Example to Camera 1. First Embodiment

[Configuration of Imaging Element]

Figure 1:
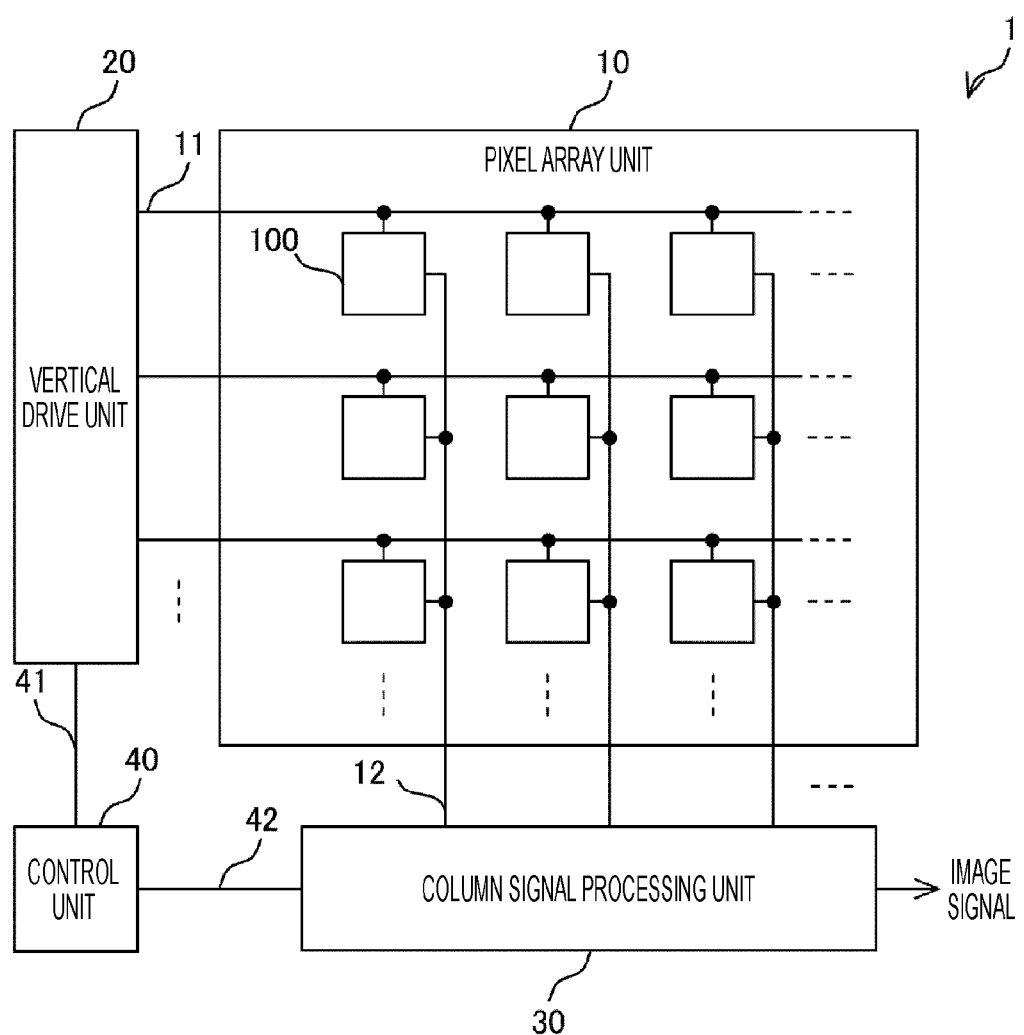
FIG. 1 is a view illustrating a configuration example of an imaging element according to an embodiment of the present disclosure.

FIG. 1 is a view illustrating a configuration example of an imaging element according to an embodiment of the present disclosure. An imaging element 1 in the drawing is provided with a pixel array unit 10, a vertical drive unit 20, a column signal processing unit 30, and a control unit 40.

The pixel array unit 10 is formed by arranging pixels 100 in a two-dimensional lattice pattern. Here, the pixel 100 generates an image signal according to applied light. The pixel 100 includes a photoelectric conversion unit that generates an electric charge according to the applied light. Furthermore, the pixel 100 further includes a pixel circuit. The pixel circuit generates the image signal based on the electric charge generated by the photoelectric conversion unit. Generation of the image signal is controlled by a control signal generated by the vertical drive unit 20 to be described later. In the pixel array unit 10, signal lines 11 and 12 are arranged in an XY matrix pattern. The signal line 11, which is a signal line that transmits the control signal of the pixel circuit in the pixel 100, is arranged for each row of the pixel array unit 10 and is commonly wired to the pixels 100 arranged in each row. The signal line 12, which is a signal line that transmits the image signal generated by the pixel circuit of the pixel 100, is arranged for each column of the pixel array unit 10 and is commonly wired to the pixels 100 arranged in each column. The photoelectric conversion unit and the pixel circuit are formed in a semiconductor substrate.

The vertical drive unit 20 generates the control signal of the pixel circuit of the pixel 100. The vertical drive unit 20 transmits the generated control signal to the pixel 100 via the signal line 11 in the drawing. The column signal processing unit 30 processes the image signal generated by the pixel 100. The column signal processing unit 30 processes the image signal transmitted from the pixel 100 via the signal line 12 in the drawing. The processing by the column signal processing unit 30 corresponds to, for example, analog-digital conversion to convert an analog image signal generated in the pixel 100 into a digital image signal. The image signal processed by the column signal processing unit 30 is output as the image signal of the imaging element 1. The control unit 40 controls an entire imaging element 1. The control unit 40 controls the imaging element 1 by generating and outputting the control signal that controls the vertical drive unit 20 and the column signal processing unit 30. The control signal generated by the control unit 40 is transmitted to the vertical drive unit 20 and the column signal processing unit 30 via signal lines 41 and 42, respectively. Note that, the column signal processing unit 30 is an example of a processing circuit recited in claims.

[Configuration of Pixel]

Figure 2:
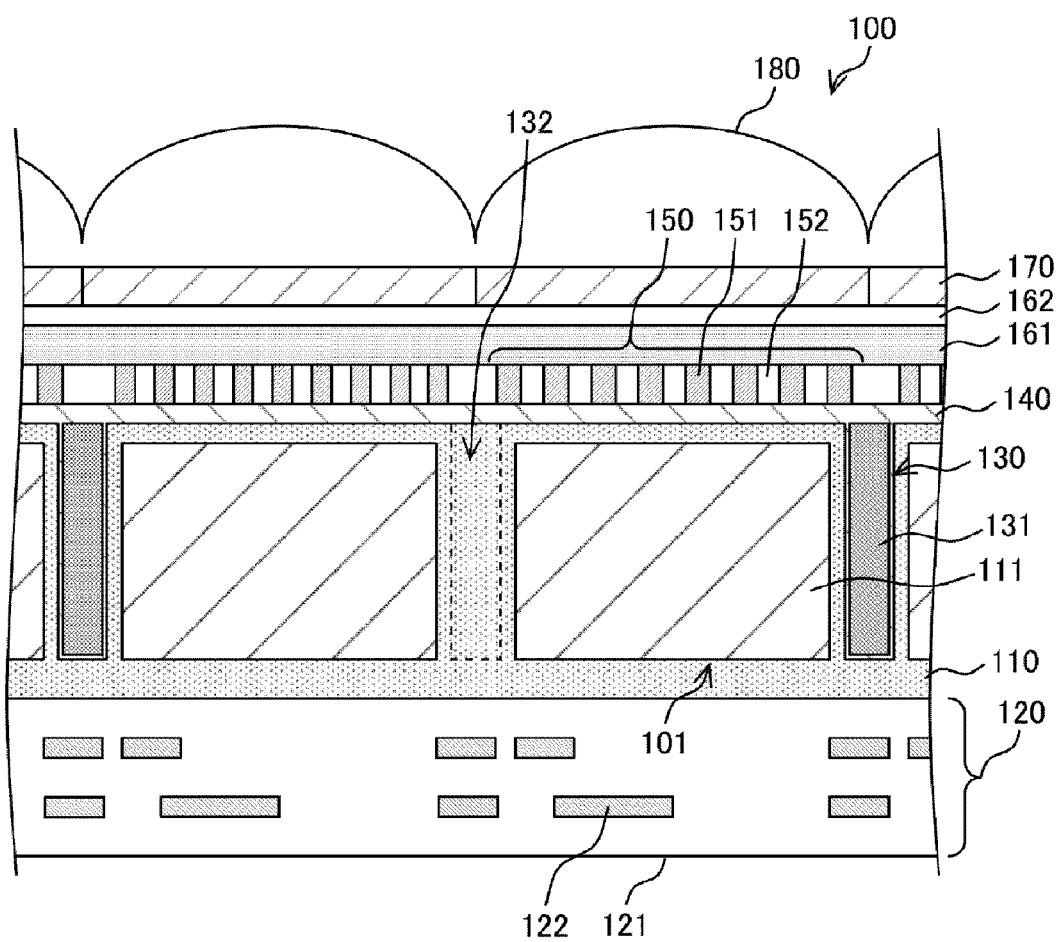
FIG. 2 is a view illustrating a configuration example of a pixel according to a first embodiment of the present disclosure.

FIG. 2 is a view illustrating a configuration example of the pixel according to a first embodiment of the present disclosure. The drawing is a schematic cross-sectional view illustrating a configuration example of the pixel 100. The pixel 100 in the drawing is provided with a semiconductor substrate 110, a wiring region 120, a separation region 131, a non-separation region 132, insulating films 140 and 161, a polarization unit 150, a protective film 162, a color filter 170, and an on-chip lens 180.

The semiconductor substrate 110 is a semiconductor substrate in which a diffusion region of an element of the photoelectric conversion unit, the pixel circuit and the like is formed. As the semiconductor substrate 110, for example, a semiconductor substrate of silicon (Si) may be used. The diffusion region of the element of the photoelectric conversion unit and the pixel circuit is formed in a well region formed in the semiconductor substrate 110. For convenience, the semiconductor substrate 110 in the drawing is assumed to be formed in a p-type well region. By arranging an n-type semiconductor region in the p-type well region, the diffusion region of the element of the photoelectric conversion unit and the pixel circuit may be formed.

In the drawing, a photoelectric conversion unit 101 is illustrated as an example thereof. The photoelectric conversion unit 101 includes an n-type semiconductor region 111 arranged in the semiconductor substrate 110 in the drawing. Specifically, a photodiode by pn junction of an interface between the n-type semiconductor region 111 and the p-type well region around the same corresponds to the photoelectric conversion unit 101. When the pn junction portion is irradiated with incident light, the electric charge due to photoelectric conversion is generated. An electron out of the electric charge is accumulated in the n-type semiconductor region 111. The image signal is generated by the pixel circuit not illustrated on the basis of the accumulated charge (electron).

The wiring region 120 is a region arranged adjacent to a front surface of the semiconductor substrate 110 in which wiring that transmits a signal to the element and the like of the pixel circuit of the pixel 100 is formed. The wiring region 120 in the drawing includes a wiring layer 122 and an insulating layer 121. The wiring layer 122 is wiring that transmits a signal. The wiring layer 122 may include metal such as copper (Cu), for example. The insulating layer 121 insulates the wiring layer 122. The insulating layer 121 may include, for example, silicon oxide ($SiO_2$) and silicon nitride (SiN).

The insulating film 140 is a film that is arranged adjacent to a back surface of the semiconductor substrate 110 and protects the back surface of the semiconductor substrate 110. The insulating film 140 may include, for example, $SiO_2$ and SiN. Note that, a fixed charge film for pinning an interface state of the semiconductor substrate 110 may be arranged between the semiconductor substrate 110 and the insulating film 140. As the fixed charge film, for example, a film of hafnium oxide ($HfO_2$) may be used.

The polarization unit 150 is arranged on a surface of the insulating film 140 and polarizes incident light from a subject in a specific polarization direction. As the polarization unit 150, for example, a polarization unit that polarizes the incident light by transmitting the incident light in the specific polarization direction may be used. The polarization unit 150 in the drawing illustrates an example of the polarization unit including a wire grid. The wire grid is the polarization unit formed by arranging a plurality of strip-shaped conductors at a predetermined pitch. The polarization unit 150 in the drawing is formed by arranging strip-shaped conductors 151. A dielectric such as air may be arranged in a region 152 between a plurality of strip-shaped conductors 151.

The incident light in the polarization direction perpendicular to an arrangement direction of the strip-shaped conductors 151, that is, in the polarization direction parallel to the strip-shaped conductors 151 is attenuated by the polarization unit 150. This is because the electric charge inside the strip-shaped conductor 151 is vibrated by the incident light to generate reflected light. In contrast, the incident light in the polarization direction parallel to the arrangement direction of the strip-shaped conductors 151, that is, in the polarization direction perpendicular to the strip-shaped conductors 151 is transmitted through the polarization unit 150. This is because the vibration of the electric charge inside the strip-shaped conductor 151 is limited. The polarization direction of transmission through the polarization unit 150 is referred to as a transmission axis.

Furthermore, a ratio between maximum transmitted light and minimum transmitted light out of the transmitted light of the polarization unit 150 is referred to as an extinction ratio. As described above, the polarization unit 150 transmits the light in the specific polarization direction (transmission axis). In contrast, the polarization unit 150 attenuates light in the polarization direction different from the transmission axis. The transmitted light in the polarization direction different from the transmission axis by 90 degrees has a maximum attenuation amount. A ratio between a maximum value and a minimum value of such transmitted light is the extinction ratio. As the extinction ratio is higher, polarization information with less noise may be acquired. Note that, by arranging the polarization unit 150 adjacent to the back surface of the semiconductor substrate 110 in which the separation region 131 to be described later is arranged, crosstalk may be reduced. The polarization unit 150 in the drawing is arranged adjacent to the back surface of the semiconductor substrate 110 via the insulating film 140.

The insulating film 161 is a film that insulates the polarization unit 150. Furthermore, the insulating film 161 further protects the strip-shaped conductors 151 of the polarization unit 150. The insulating film 161 may include, for example, $SiO_2$.

The protective film 162 is a film that protects and flattens the back surface of the semiconductor substrate 110. By arranging the protective film 162, a surface on which the color filter 170 to be described later is arranged is flattened, and occurrence of color unevenness may be prevented.

The color filter 170 is an optical filter that transmits light of a predetermined wavelength out of the incident light. By arranging the color filter 170, a color image signal may be generated. As the color filter 170, for example, the color filter that transmits red light, green light, and blue light may be used.

The on-chip lens 180 is a lens that is arranged for each pixel 100 and condenses the incident light. The on-chip lens 180 is formed into a hemispherical shape and condenses the incident light on the photoelectric conversion unit 101 (n-type semiconductor region 111). The on-chip lens 180 may include, for example, an organic material such as an acrylic resin or an inorganic material such as SiN.

In the pixel 100 in the drawing, the incident light condensed by the on-chip lens 180 and transmitted through the color filter 170 and the polarization unit 150 is applied to the photoelectric conversion unit 101 from the back surface of the semiconductor substrate 110. Such imaging element 1 in which the incident light is applied to the back surface of the semiconductor substrate 110 is referred to as a back-illuminated imaging element. Here, a surface irradiated with the incident light of the imaging element 1 is referred to as an incidence surface.

The separation region 131 is arranged at a boundary of the pixel 100 in the semiconductor substrate 110. The separation region 131 is formed into a shape surrounding the semiconductor substrate 110 of the pixel 100, and separates the pixel 100. By arranging the separation region 131, it is possible to prevent movement of the electric charge between the adjacent pixels 100, and to reduce the crosstalk. Here, the crosstalk means a change in image signal by an influence of the adjacent pixel 100 that causes noise of the image signal. The separation region 131 in the drawing may be formed by, for example, embedding a member for separation in a groove-shaped recess 130 formed in the semiconductor substrate 110. The separation region 131 in the drawing illustrates an example in which this separates the pixel 100 on the back surface, which is the incidence surface, of the semiconductor substrate 110 and is formed from the back surface of the semiconductor substrate 110 at a depth not reaching the front surface.

Furthermore, it is preferable to use a member that shields the incident light as the member for separation. This is because leakage of the incident light of the adjacent pixels 100 may be prevented, and the crosstalk may be further reduced. Specifically, by preventing incidence of light transmitted through the color filter 170 corresponding to a different wavelength in the adjacent pixel 100, occurrence of color mixing may be prevented. Here, the color mixing is a phenomenon that the image signal of a different color is mixed in, and is an example of the crosstalk. Furthermore, by arranging the separation region 131 of the member that shields the incident light, it is possible to prevent incidence of the incident light polarized in the different direction by the polarization unit 150 in the adjacent pixel 100. It is possible to prevent the above-described deterioration in the extinction ratio.

As the member that shields the incident light, for example, a metal material such as tungsten (W), aluminum (Al), and copper (Cu) may be used. The separation region 131 in the drawing is formed by arranging an insulating film on an inner wall of the recess 130 formed at a boundary portion of the pixel 100 in the semiconductor substrate 110 and embedding W, which is the above-described metal material.

The non-separation region 132 is further arranged in the semiconductor substrate 110 at the boundary of the pixel 100. The non-separation region 132 includes the semiconductor substrate 110 in a clearance of the separation region 131 described above. A rectangle indicated by a broken line of the semiconductor substrate 110 in the drawing represents the non-separation region 132. The clearance of the separation region 131 is arranged in the vicinity of a corner of the pixel 100. Configurations of the separation region 131 and the non-separation region 132 are described later in detail.

[Configuration of Separation Region]

Figure 3:
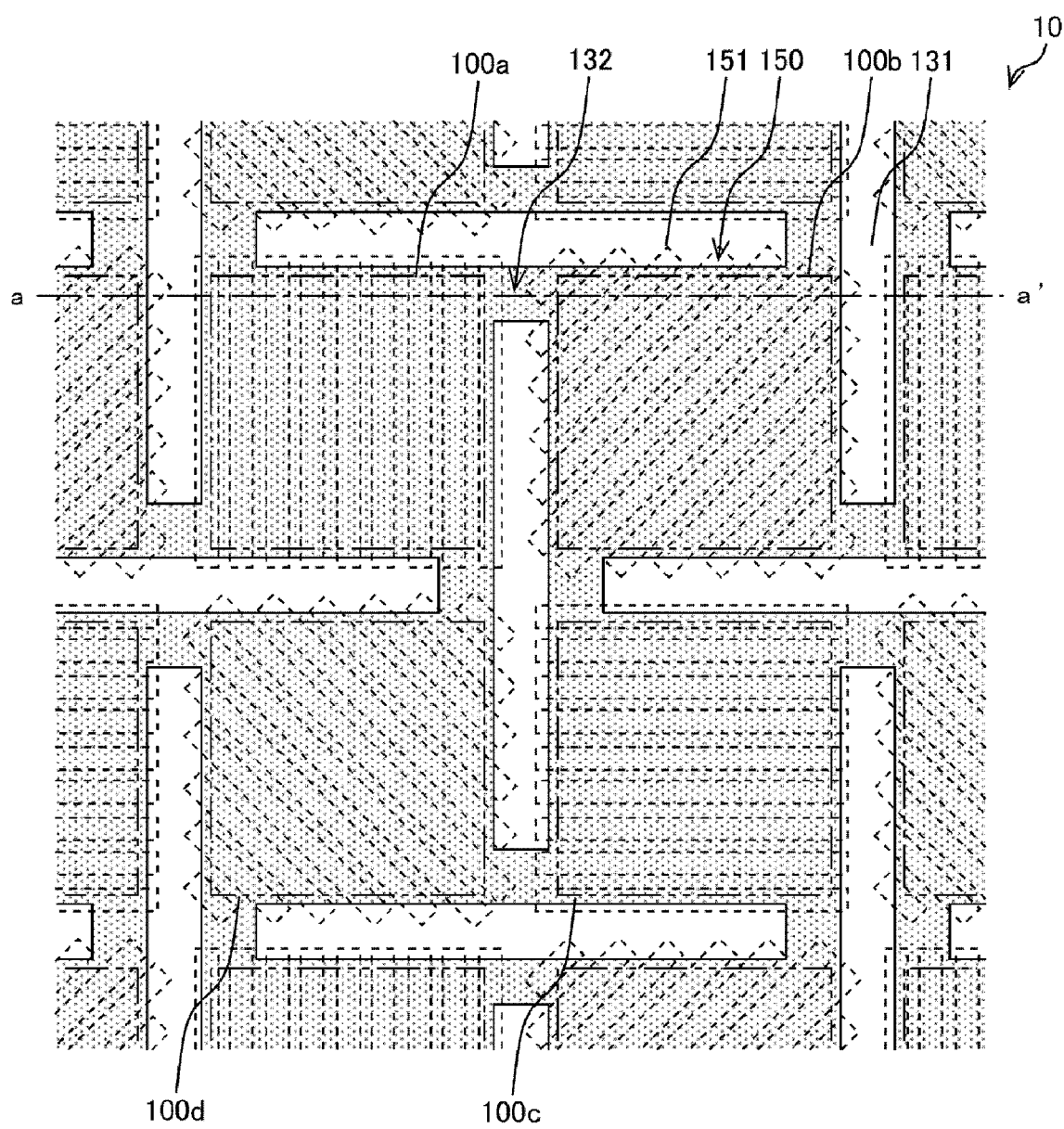
FIG. 3 is a view illustrating a configuration example of a separation region according to the first embodiment of the present disclosure.

FIG. 3 is a view illustrating a configuration example of the separation region according to the first embodiment of the present disclosure. The drawing is a plan view as seen from the incidence surfaces of a plurality of pixels 100 arranged in the pixel array unit 10, and is a plan view illustrating the configuration example of the separation region 131 and the non-separation region 132. In the drawing, a hatched region represents the back surface of the semiconductor substrate 110. Furthermore, a rectangle indicated by a two-dot chain line represents the pixel 100. Furthermore, an outline rectangle represents the separation region 131. Furthermore, a rectangle indicated by a broken line represents the strip-shaped conductor 151 of the polarization unit 150. Note that, FIG. 2 illustrates a configuration of a cross-section taken along line a-a' in the drawing.

The drawing illustrates an example of the pixel 100 formed into a rectangular shape in plan view. Furthermore, in pixels 100a, 100b, 100c, and 100d arranged in two rows and two columns in the drawing, the polarization units 150 that polarize the incident light in the different polarization directions are arranged, respectively. That is, in the pixels 100a, 100b, 100c, and 100d, the polarization units 150 having the transmission axes different from each other by 45 degrees are arranged, respectively. By the pixels 100 in two rows and two columns, it is possible to detect the incident light in four polarization directions and generate the image signals including the polarization information in four directions.

The separation region 131 is arranged at the boundary between the pixels 100 and is arranged in a shape surrounding a periphery of the pixel 100. In contrast, the non-separation region 132 is arranged in the clearance of the separation region 131 formed in the vicinity of the corner of the pixel 100 in a rectangular shape. This clearance is formed in the separation region 131 adjacent to an intersection of longitudinal and lateral separation regions 131 arranged in a lattice pattern in plan view. As illustrated in the drawing, the separation region 131 is formed into a shape in which one of the separation regions 131 in the longitudinal or lateral direction penetrates and the other is divided by a clearance of the non-separation region 132 at an intersection at which the boundaries of the lattice-shaped pixels 100 intersect in the plan view. Furthermore, the non-separation regions 132 are arranged adjacent to the intersections of the boundaries of all the pixels 100.

As described above, the separation region 131 is arranged in the recess 130 formed in the semiconductor substrate 110. The recess 130 may be formed by etching the back surface of the semiconductor substrate 110. When the recess 130 is formed by etching, it is possible to reduce variation in depth of the recess 130 by arranging the non-separation region 132. Therefore, occurrence of the crosstalk based on the variation in depth may be reduced. The variation in depth of the recess 130 is described later in detail.

Note that, the non-separation region 132 may be arranged between the pixels 100 in which the polarization directions of the polarization units 150 arranged in the pixels 100 are not orthogonal to each other. Specifically, this is arranged between the pixel 100a and the pixel 100b, between the pixel 100b and the pixel 100c, between the pixel 100c and the pixel 100d, and between the pixel 100d and the pixel 100a in the drawing.

By arranging the non-separation region 132, the leakage of the incident light between the adjacent pixels 100 occurs. The incident light transmitted through the polarization units 150 of the different polarization directions leaks, and the extinction ratio is deteriorated. However, the separation region 131 is arranged between the pixels 100 in which the polarization units 150 the polarization directions of which are not orthogonal to each other are arranged. Therefore, the deterioration in the extinction ratio may be reduced. This is described taking the pixel 100a and the pixel 100b as an example. The non-separation region 132 is arranged between the pixel 100a and the pixel 100b. The polarization unit 150 of the pixel 100b is formed in the polarization direction shifted by 45 degrees with respect to the transmission axis of the polarization unit 150 of the pixel 100a. The incident light in the polarization direction shifted by 45 degrees with respect to the transmission axis of the polarization unit 150 is attenuated to a light amount of approximately 50% and transmitted. That is, the incident light transmitted through the polarization unit 150 of the pixel 100b mixed into the pixel 100a via the non-separation region 132 is the incident light in the polarization direction attenuated to approximately 50% in the polarization unit 150 of the pixel 100a. Therefore, even in a case where the non-separation region 132 is arranged, it is possible to limit to a slight increase in the extinction ratio.

In contrast, the non-separation region 132 is not arranged between the pixels 100 provided with the polarization units 150 the polarization directions of which are substantially orthogonal to each other. For example, it is possible to configure such that the non-separation region 132 is not arranged between the pixels 100 the polarization directions of which are different from each other by 80 to 100 degrees. In the drawing, the non-separation region 132 is not arranged between the pixel 100a and the pixel 100c and between the pixel 100b and the pixel 100d. The polarization unit 150 shields approximately 100% of the incident light in the polarization direction orthogonal to its own transmission axis. Therefore, when the incident light from the pixel 100 in which the polarization unit 150 of the polarization direction orthogonal to the same is arranged is mixed, the extinction ratio is significantly deteriorated. By not arranging the non-separation region 132 between the pixels 100 in which the polarization units 150 of the polarization directions orthogonal to each other are arranged, it is possible to prevent the incident light from mixing via the non-separation region 132. It is possible to prevent the deterioration in the extinction ratio based on the pixels 100 in which the polarization units 150 of the polarization directions orthogonal to each other are arranged. Note that, as a case where the polarization directions are substantially orthogonal to each other, a case is assumed where the polarization directions are different from each other by 80 to 100 degrees.

In this manner, by arranging the non-separation region 132 between the pixels 100 in which the polarization units 150 of the polarization directions not orthogonal to each other are arranged, it is possible to reduce the deterioration in the extinction ratio caused by the non-separation region 132.

[Configuration of Recess of Separation Region]

Figure 4A:
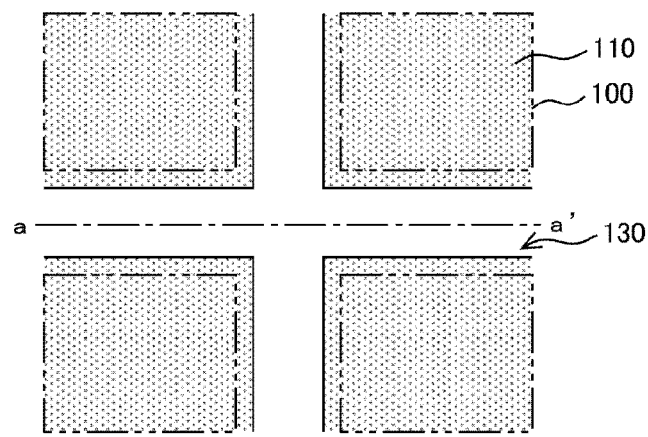
FIGS. 4A, 4B, 4C, and 4D are views illustrating an example of a recess of the separation region according to the first embodiment of the present disclosure.
Figure 4B:
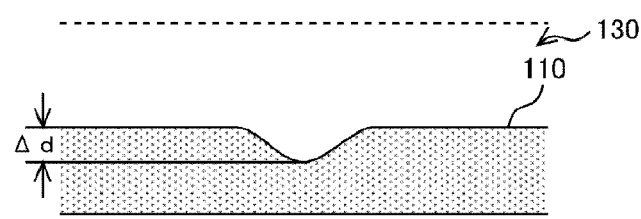
Figure 4C:
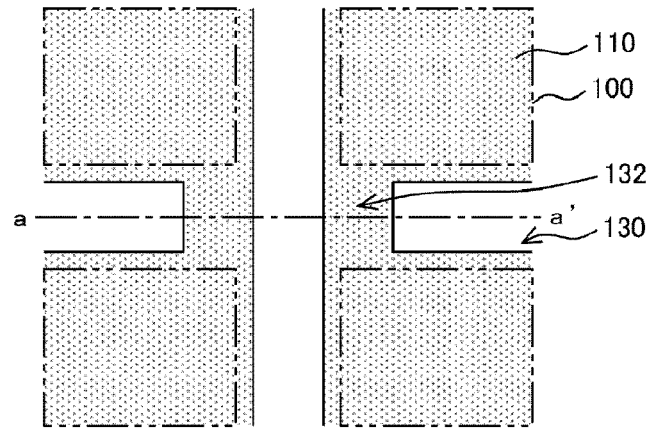
Figure 4D:
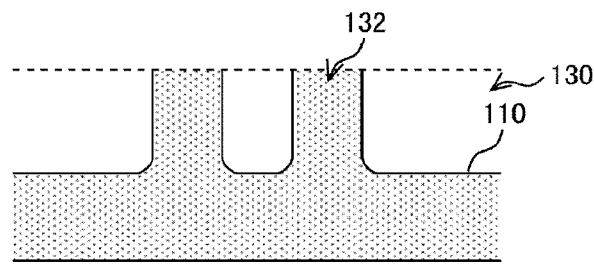

FIGS. 4A, 4B, 40, and 4D are views illustrating an example of the recess of the separation region according to the first embodiment of the present disclosure. The drawing is a view illustrating an example of a shape of the recess 130, and is a view for explaining an effect of the non-separation region 132. FIGS. 4A and 4C of the drawing are simplified plan views of the semiconductor substrate 110 and the separation region 131 of the pixel 100. FIGS. 4B and 4D of the drawing are cross-sectional views taken along line a-a' in FIGS. 4A and 4C of the drawing, respectively. Note that, FIGS. 4A and 4B of the drawing are views illustrating an example of a case where the non-separation region 132 is not arranged for comparison.

In the pixel array unit 10 in FIG. 4A of the drawing, the non-separation region 132 is not arranged, so that the recesses 130 of the separation regions 131 have shapes orthogonal to each other longitudinally and laterally in plan view. The recess 130 may be formed by, for example, etching the back surface of the semiconductor substrate 110. Anisotropic dry etching may be applied to this etching. By this anisotropic dry etching, a groove-shaped recess 130 having a high aspect ratio may be formed. This dry etching is a method of etching the semiconductor substrate 110 with an ionized etching gas with which the etching is performed while supplying the etching gas to the surface of the semiconductor substrate 110. At the time of this etching, since an area of a portion of intersection in plan view is larger than that of a linear portion, a supply amount of the etching gas increases and an etching rate increases. A phenomenon that the etching rate changes on the basis of a difference in area of an opening to be etched in this manner is referred to as a microloading phenomenon. Due to this microloading phenomenon, the portion of intersection becomes the recess 130 having a deeper shape than that in other portions.

FIG. 4B of the drawing illustrates this state. A variation in depth of Ad occurs between the portion in which the recesses 130 intersect and the other portions. In the semiconductor substrate 110 at the boundary other than the corner of the pixel 100, the separation region 131 becomes shallower by Ad, so that the crosstalk from the adjacent pixel 100 via the region becomes larger. Since long-wavelength incident light such as red light and infrared light reaches a deep portion of the semiconductor substrate 110, the crosstalk further increases in the pixel 100 in which the color filter 170 that transmits the long-wavelength incident light such as the red light is arranged.

In contrast, as illustrated in FIG. 4C of the drawing, by arranging the non-separation region 132 to arrange the clearance in the separation region 131, it is possible to prevent the area of the portion of intersection described above from increasing. Occurrence of the microloading phenomenon may be prevented, and the recess 130 having a uniform depth may be formed.

[Manufacturing Method of Pixel]

Figure 5A:
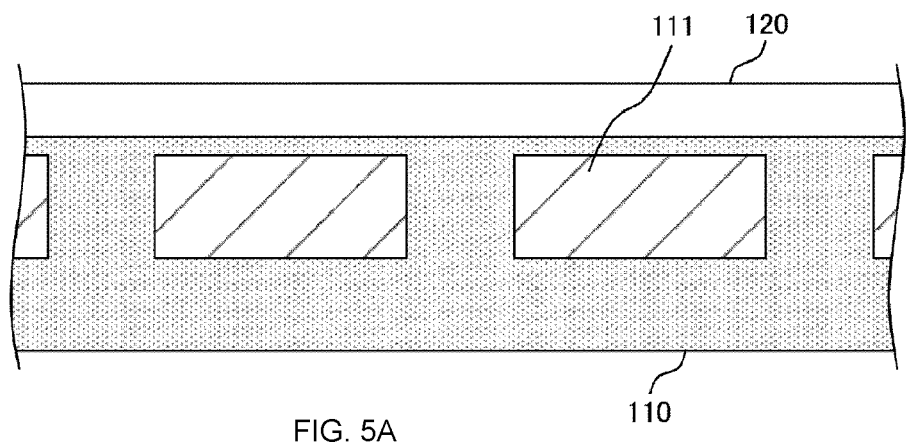
FIGS. 5A, 5B, 5O, and 5D are views illustrating an example of a manufacturing method of a pixel according to the first embodiment of the present disclosure.
Figure 5B:
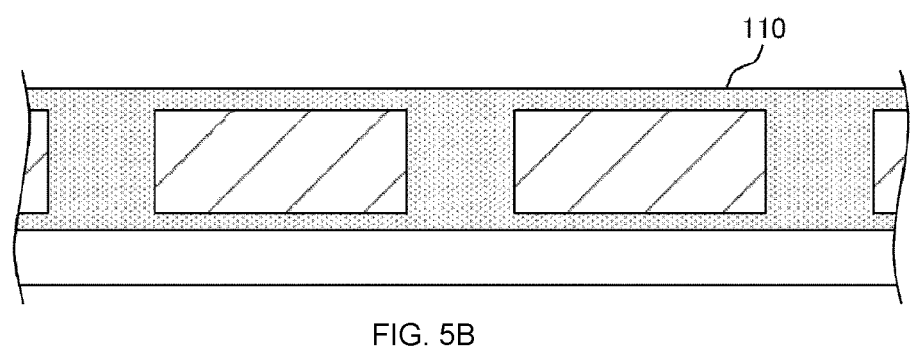

FIGS. 5A, 5B, 50, 5D, 6A, 6B, 60, 6D, 7A, 7B, and 7C are views illustrating an example of a manufacturing method of the imaging element according to the first embodiment of the present disclosure. FIGS. 5A, 5B, 50, 5D, 6A, 6B, 6C, 6D, 7A, 7B, and 7C are views illustrating an example of a manufacturing step of the imaging element 1. First, the p-type well region is formed in the semiconductor substrate 110. The n-type semiconductor region 111 and the like forming the photoelectric conversion unit 101 is formed in the p-type well region. This may be performed by, for example, ion injection. Next, the wiring region 120 is formed on the front surface of the semiconductor substrate 110 (FIG. 5A). This step corresponds to a photoelectric conversion unit forming step. Next, the semiconductor substrate 110 is inverted upside down, a back surface side thereof is ground, and the semiconductor substrate 110 is formed into a desired thickness (FIG. 5B).

Figure 5C:
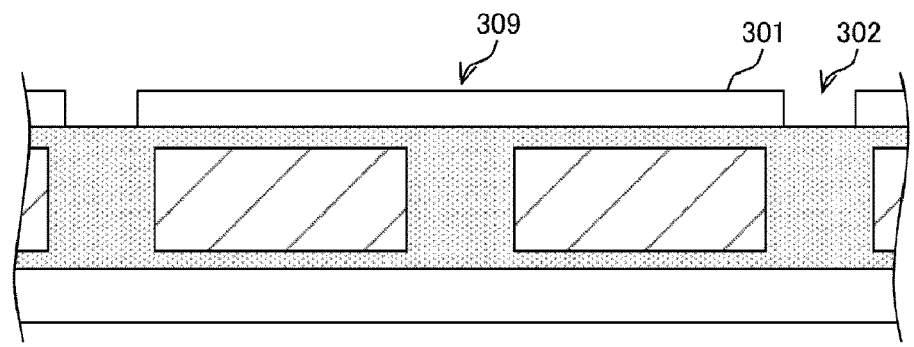
Figure 5D:
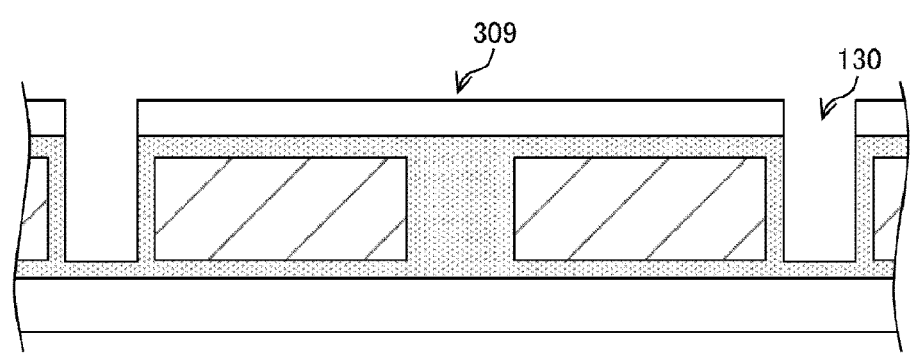

Next, a resist 301 is arranged on the back surface of the semiconductor substrate 110. In the resist 301, an opening 302 is arranged in a region in which the recess 130 is formed. In contrast, no opening is formed in a region 309 in which the non-separation region 132 is arranged (FIG. 5C). Next, etching is performed using the resist 301 as a mask. The dry etching described above may be applied to this etching. The recess 130 is formed by this etching. Note that, the region 309 in which the non-separation region 132 is arranged is not etched, and the clearance of the separation region 131 illustrated in FIG. 2 is formed (FIG. 5D). Thereafter, the resist 301 is removed. This step corresponds to a recess forming step.

Figure 6A:
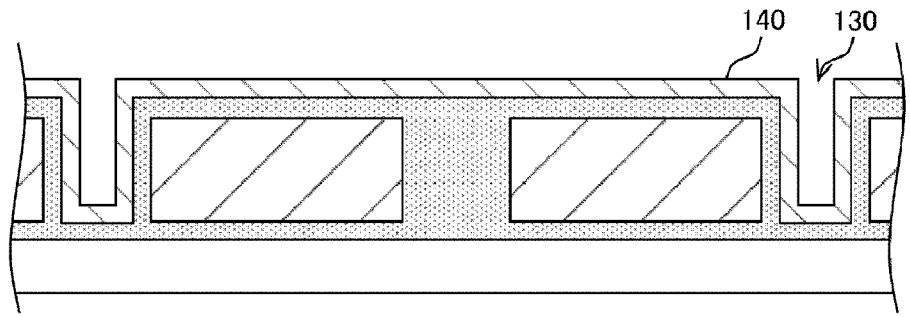
FIGS. 6A, 6B, 6C, and 6D are views illustrating an example of the manufacturing method of the pixel according to the first embodiment of the present disclosure.
Figure 6B:
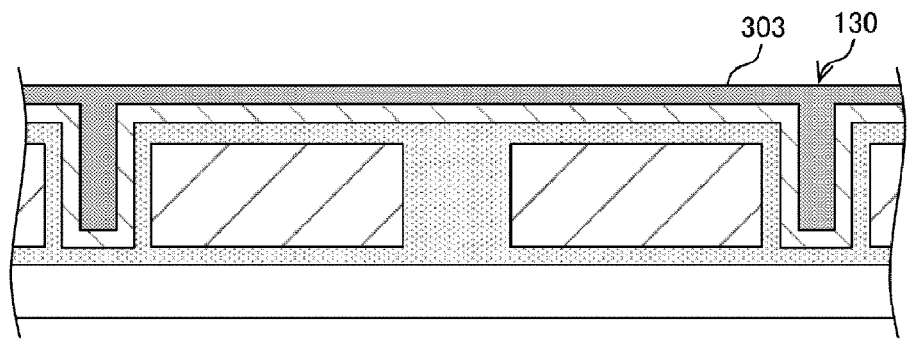
Figure 6C:
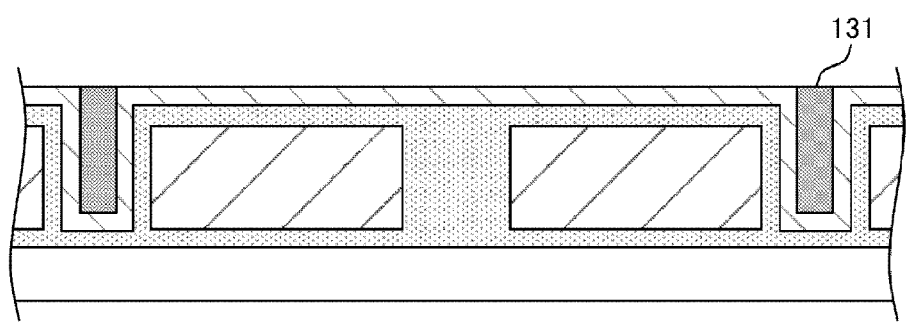

Next, the insulating film 140 is formed on the back surface of the semiconductor substrate 110 including the inner wall of the recess 130. This may be performed by, for example, chemical vapor deposition (CVD). Note that, the fixed charge film may also be formed on the back surface of the semiconductor substrate 110 including the inner wall of the recess 130 before forming the insulating film 140 (FIG. 6A). Next, a metal film 303 is arranged on the back surface of the semiconductor substrate 110 including the inner wall of the recess 130. This may be performed by, for example, forming a film of W by CVD. Therefore, the metal material may be embedded in the recess 130 (FIG. 6B). Next, the back surface of the semiconductor substrate 110 is ground to remove the metal film 303 other than that in the recess 130. This may be performed by, for example, chemical mechanical polishing (CMP). Therefore, the separation region 131 may be formed (G of FIG. 6C). This step corresponds to a separation region forming step.

Figure 6D:
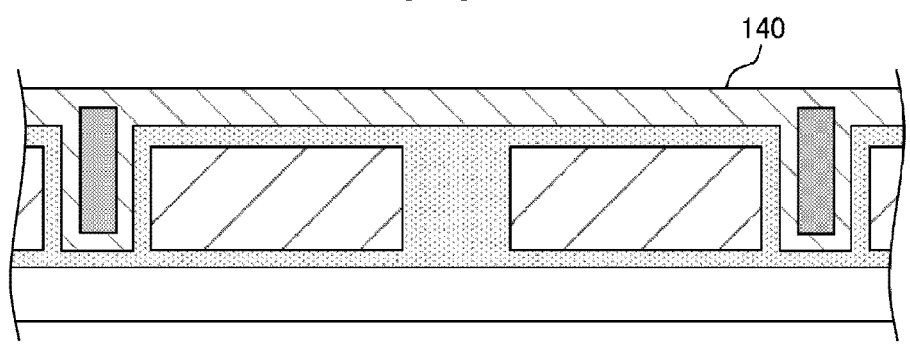
Figure 7A:
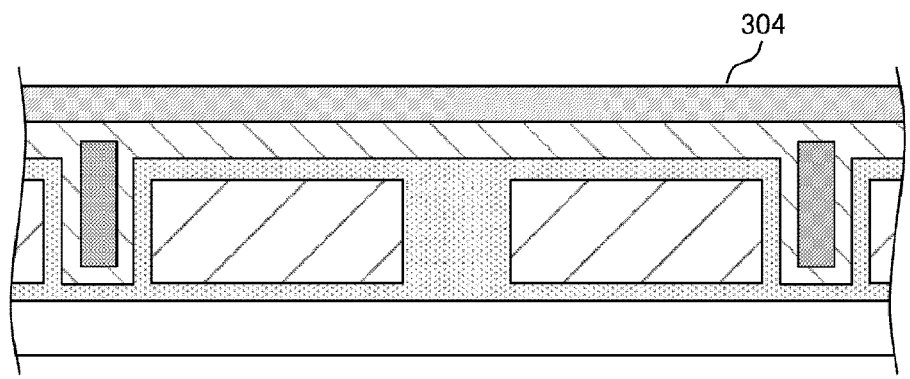
FIGS. 7A, 7B, and 7C are views illustrating an example of the manufacturing method of the pixel according to the first embodiment of the present disclosure.
Figure 7B:
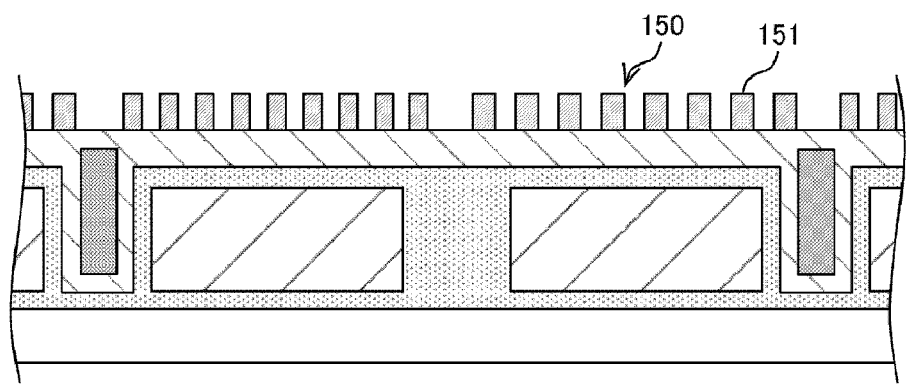

Next, the insulating film 140 is formed again on the back surface of the semiconductor substrate 110 (FIG. 6D). Next, a metal film 304 to be the material of the strip-shaped conductor 151 of the polarization unit 150 is arranged. This may be performed by, for example, sputtering (FIG. 7A). Next, the strip-shaped conductors 151 are formed by etching the metal film 304, and the polarization unit 150 is formed (FIG. 7B). This step corresponds to a polarization unit forming step.

Figure 7C:
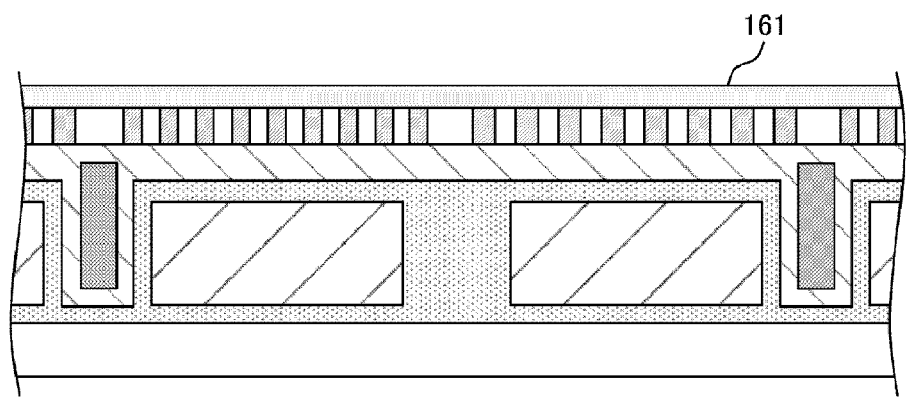

Next, the insulating film 161 is arranged (FIG. 7C). Thereafter, the imaging element 1 may be manufactured by forming the protective film 162, the color filter 170, and the on-chip lens 180.

Note that, the configuration of the imaging element 1 is not limited to this example. For example, the separation region 131 formed by embedding an insulating member of $SiO_2$, SiN and the like in the recess 130 may also be used. Furthermore, it is also possible to adopt a configuration of generating a monochrome image signal by omitting the color filter 170 of the pixel 100.

As described above, in the imaging element 1 of the first embodiment of the present disclosure, the separation region 131 is arranged between a plurality of pixels 100 provided with the polarization unit 150, and the non-separation region 132 is formed by the semiconductor substrate 110 in the clearance of the separation region 131 at the corner of the pixel 100. Therefore, it is possible to reduce the variation in depth of the recess 130 for arranging the separation region 131, and to reduce the crosstalk.

2. Second Embodiment

In the imaging element 1 of the first embodiment described above, the four types of polarization units 150 of the different polarization directions are arranged in the pixels 100. In contrast, an imaging element 1 of a second embodiment of the present disclosure is different from that of the first embodiment described above in reducing types of polarization units 150 arranged in pixels 100.

[Configuration of Separation Region]

Figure 8:
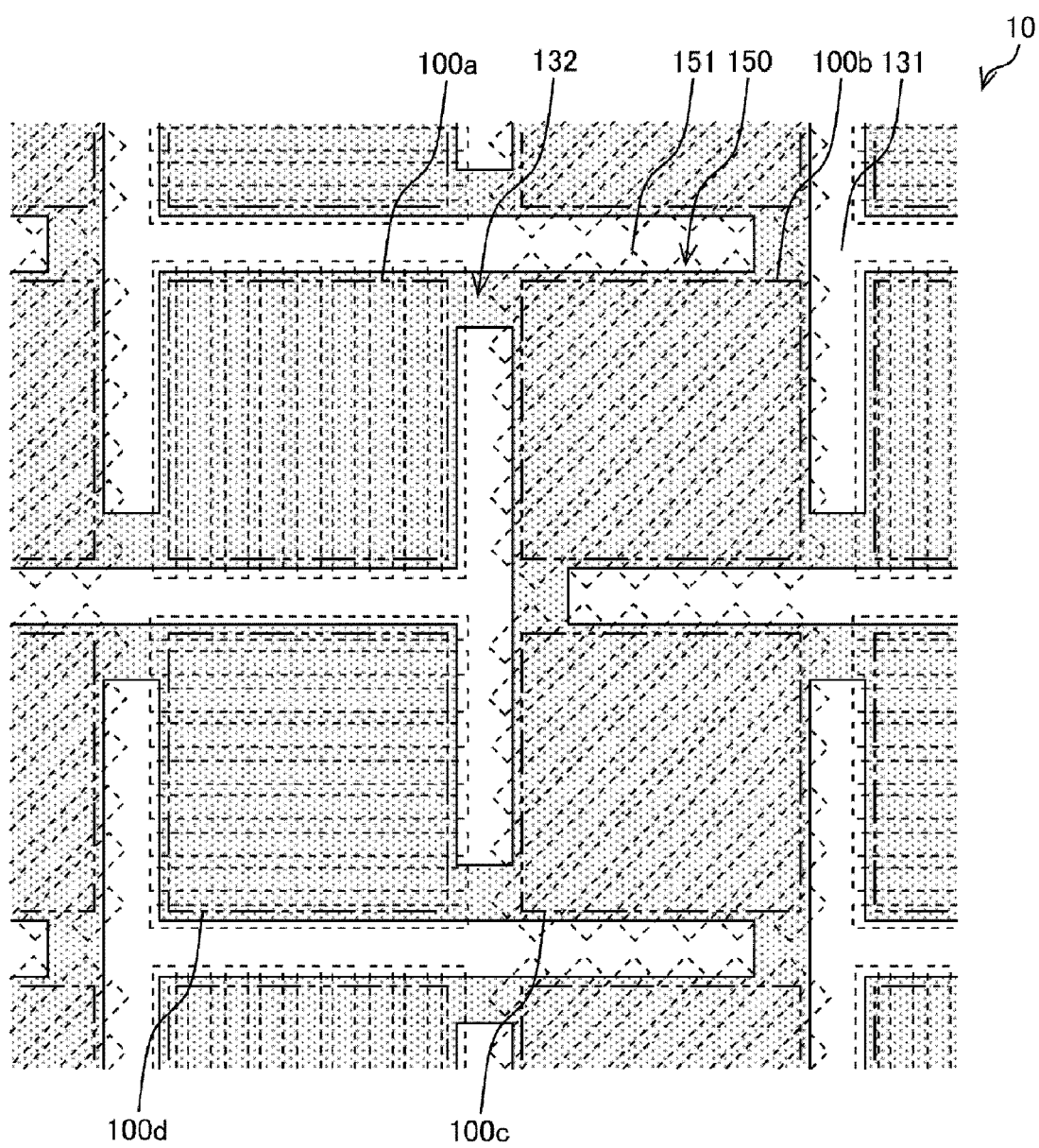
FIG. 8 is a view illustrating a configuration example of a separation region according to a second embodiment of the present disclosure.

FIG. 8 is a view illustrating a configuration example of a separation region according to the second embodiment of the present disclosure. Similarly to FIG. 3, the drawing is a plan view as seen from incidence surfaces of a plurality of pixels 100 arranged in a pixel array unit 10. This is different from the pixel array unit 10 described with reference to FIG. 3 in that three types of polarization units 150 of different polarization directions are arranged in the pixels 100.

In a pixel 100d in the drawing, the polarization unit 150 a polarization direction of which is orthogonal to that of the polarization unit 150 of a pixel 100a is arranged. In a pixel 100b and a pixel 100c, the polarization units 150 of the same polarization direction are arranged. The polarization units 150 of the pixel 100b and the pixel 100c are the polarization units the polarization direction of which is different from that of the polarization units 150 of the pixel 100a and the pixel 100d by 45 degrees. A non-separation region 132 is arranged between the pixel 100a and the pixel 100b, between the pixel 100b and the pixel 100c, and between the pixel 100c and the pixel 100d. In this manner, the non-separation region 132 is arranged between the pixels 100 in which the polarization units 150 the polarization directions of which are not orthogonal to each other are arranged. One non-separation region 132 is arranged at an intersection of boundaries of the pixels 100, and a T-shaped separation region 131 is formed in plan view. By arranging the non-separation region 132, occurrence of a microloading phenomenon may be reduced.

Since a configuration of the imaging element 1 other than this is similar to the configuration of the imaging element 1 described in the first embodiment of the present disclosure, the description thereof is omitted.

As described above, in the imaging element 1 of the second embodiment of the present disclosure, the non-separation region 132 is formed by using a semiconductor substrate 110 in a clearance of the separation region 131 at a corner of the pixel 100 also in a case of reducing the types of the polarization units 150. Therefore, it is possible to reduce the variation in depth of the recess 130 for arranging the separation region 131, and to reduce the crosstalk.

3. Third Embodiment

In the imaging element 1 of the first embodiment described above, the separation region 131 is arranged on the back surface of the semiconductor substrate 110. In contrast, an imaging element 1 of a third embodiment of the present disclosure is different from that of the first embodiment described above in that a separation region 131 that penetrates from a back surface to a front surface of a semiconductor substrate 110 is arranged.

[Configuration of Pixel]

Figure 9:
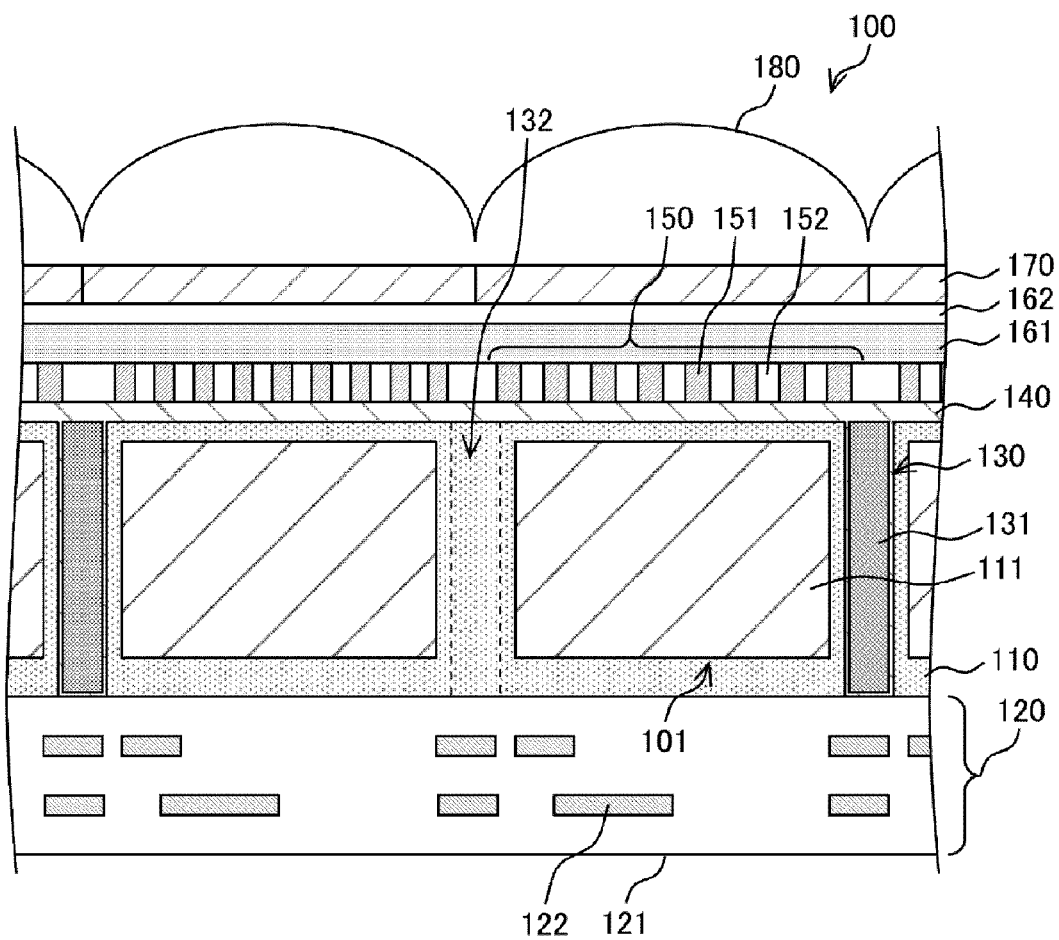
FIG. 9 is a view illustrating a configuration example of a pixel according to a third embodiment of the present disclosure.

FIG. 9 is a view illustrating a configuration example of a pixel according to the third embodiment of the present disclosure. Similarly to FIG. 2, the drawing is a schematic cross-sectional view illustrating a configuration example of a pixel 100. This is different from the pixel 100 described with reference to FIG. 2 in that the separation region 131 penetrates the semiconductor substrate 110.

The separation region 131 in the drawing is arranged in a recess 130 penetrating from the back surface to the front surface of the semiconductor substrate 110, and is formed into a shape penetrating the semiconductor substrate 110. Therefore, separation capacity of the pixel 100 may be improved. Even in a case where the semiconductor substrate 110 is thin, crosstalk may be reduced. In this case also, it is possible to reduce variation in depth of the recess 130 by arranging a non-separation region 132.

Since a configuration of the imaging element 1 other than this is similar to the configuration of the imaging element 1 described in the first embodiment of the present disclosure, the description thereof is omitted.

As described above, the imaging element 1 of the third embodiment of the present disclosure may further reduce an influence of the crosstalk by arranging the separation region 131 penetrating the semiconductor substrate 110.

4. Fourth Embodiment

In the imaging element 1 of the first embodiment described above, the non-separation region 132 is arranged in the clearance of the separation region 131. In contrast, an imaging element 1 of a fourth embodiment of the present disclosure suggests a size of a clearance of a separation region 131.

[Configuration of Separation Region]

Figure 10:
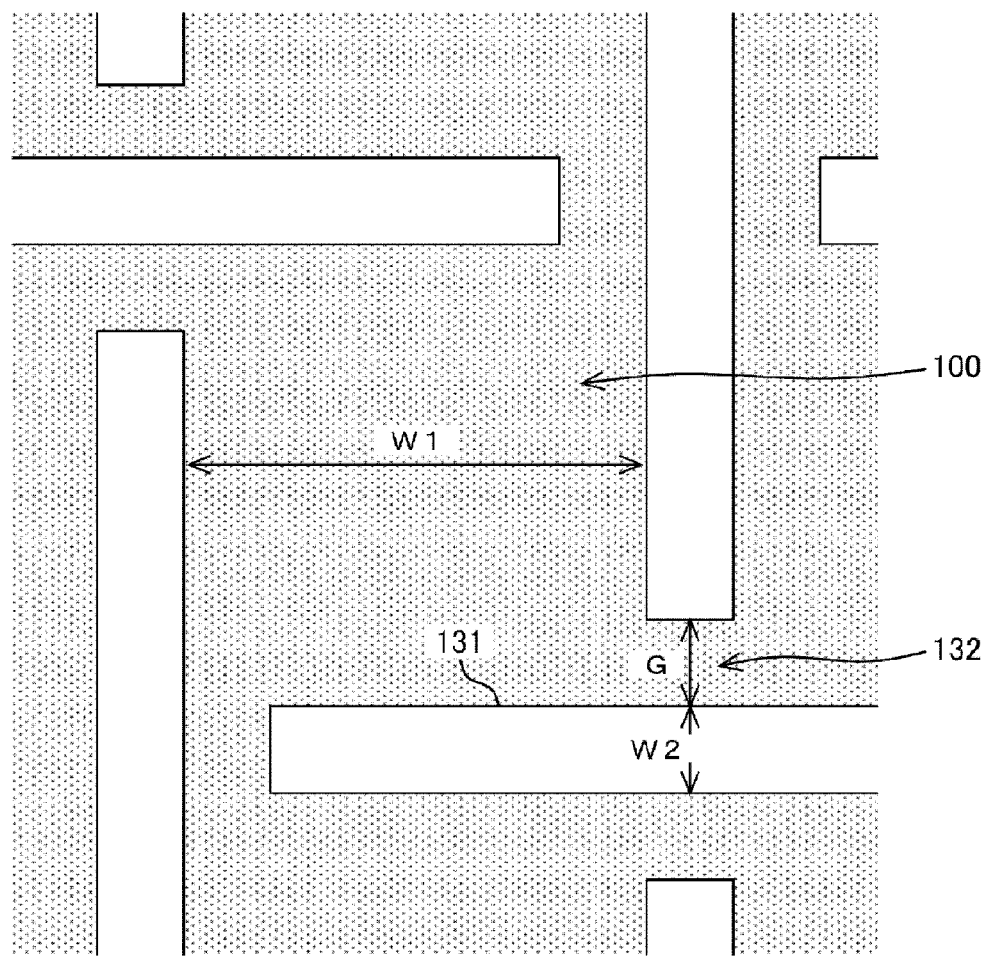
FIG. 10 is a view illustrating a configuration example of a separation region according to a fourth embodiment of the present disclosure.

FIG. 10 is a view illustrating a configuration example of the separation region according to the fourth embodiment of the present disclosure. The drawing is a plan view as seen from incidence surfaces of a plurality of pixels 100, and is a view illustrating configurations of the separation region 131 and a non-separation region 132 in a simplified manner.

As described above, by arranging the non-separation region 132, occurrence of a microloading phenomenon may be reduced, and crosstalk may be reduced. In contrast, by arranging the non-separation region 132, the crosstalk via the non-separation region 132 occurs. By limiting the size of the clearance of the separation region 131 in which the non-separation region 132 is arranged, an influence of the crosstalk via the non-separation region 132 may be reduced. Specifically, a gap G of the clearance is formed to be substantially 10% or less of a width W1 of a pixel 100 in a rectangular shape. Therefore, a ratio of an error due to the crosstalk caused by the non-separation region 132 to an image signal may be reduced, and it is possible to reduce the influence of the crosstalk via the non-separation region 132 while reducing the occurrence of the microloading phenomenon.

Furthermore, the gap G of the clearance may be formed to have a size substantially equal to a width W2 of the separation region 131. For example, the width W2 of the separation region 131 and the gap G of the clearance may be formed to have a size of 100 nm. In this case also, the occurrence of the microloading phenomenon may be reduced.

Since a configuration of the imaging element 1 other than this is similar to the configuration of the imaging element 1 described in the first embodiment of the present disclosure, the description thereof is omitted.

As described above, the imaging element 1 of the fourth embodiment of the present disclosure limits the size of the clearance of the separation region 131 in which the non-separation region 132 is arranged. Therefore, it becomes possible to reduce the influence of the crosstalk via the non-separation region 132 while reducing the occurrence of the microloading phenomenon.

5. Fifth Embodiment

In the imaging element 1 of the first embodiment described above, the pixel 100 provided with the polarization unit 150 is arranged. In contrast, an imaging element 1 of a fifth embodiment of the present disclosure is different from that of the first embodiment described above in that a pixel not provided with a polarization unit 150 is further arranged.

[Configuration of Separation Region]

Figure 11:
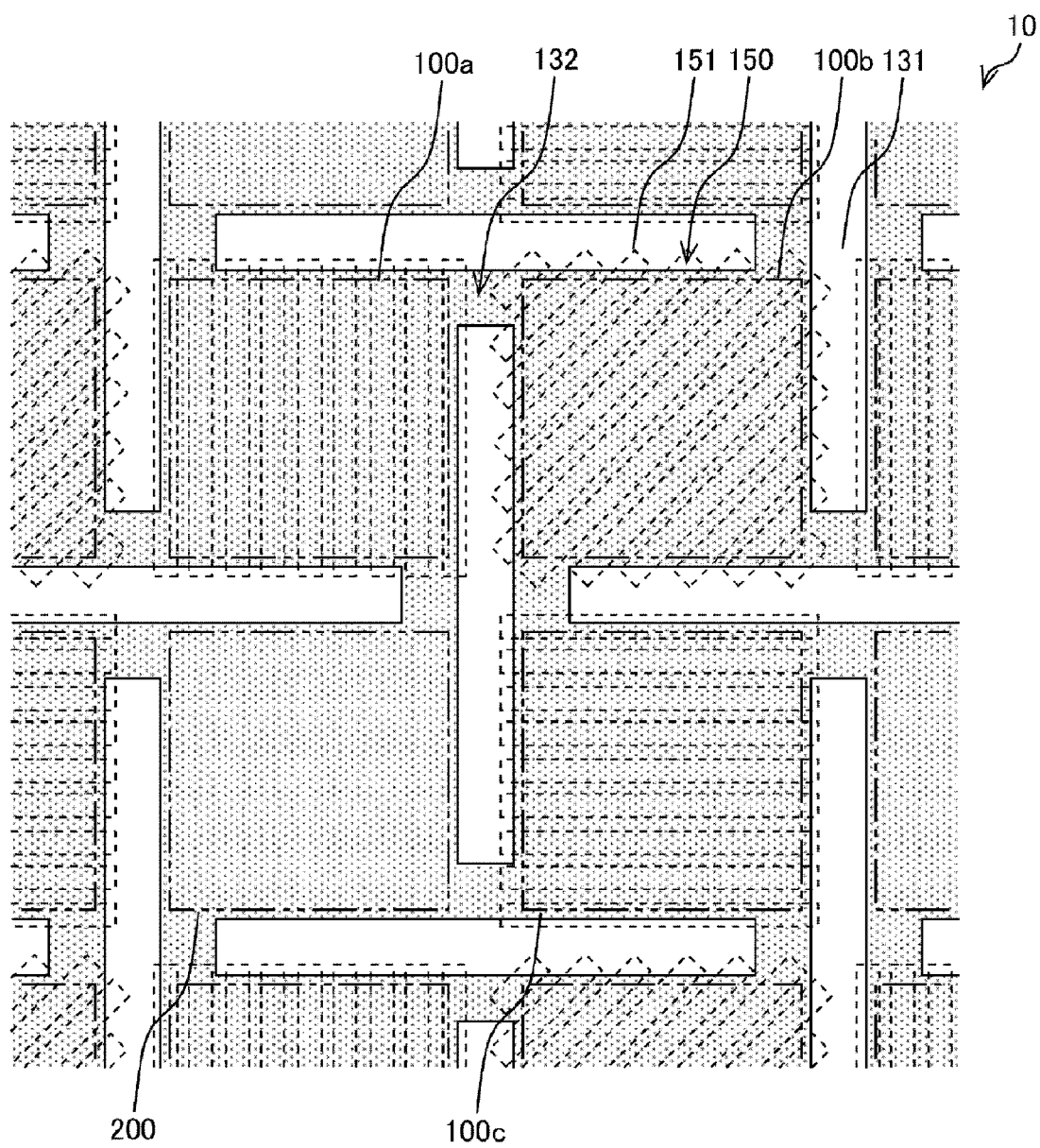
FIG. 11 is a view illustrating a configuration example of a separation region according to a fifth embodiment of the present disclosure.

FIG. 11 is a view illustrating a configuration example of a separation region according to the fifth embodiment of the present disclosure. Similarly to FIG. 3, the drawing is a plan view as seen from incidence surfaces of a plurality of pixels 100 arranged in a pixel array unit 10. This is different from the pixel array unit 10 described with reference to FIG. 3 in that a pixel 200 not provided with the polarization unit 150 is arranged.

The pixel 200 in the drawing is a pixel not provided with the polarization unit 150. The pixel 200 is the pixel that generates a normal image signal not including polarization information. The pixel 200 may include a pixel in which a protective film 162 is arranged in place of the polarization unit 150 in the pixel 100 in FIG. 2. A non-separation region 132 may be arranged between the pixel 100 and the pixel 200. Furthermore, in the imaging element 1 in the drawing also, the non-separation region 132 is arranged between the pixels 100 in which the polarization units 150 of polarization directions not orthogonal to each other are arranged. Note that, the pixel 200 is an example of a second pixel recited in claims.

Since a configuration of the imaging element 1 other than this is similar to the configuration of the imaging element 1 described in the first embodiment of the present disclosure, the description thereof is omitted.

As described above, the imaging element 1 of the fifth embodiment of the present disclosure may reduce occurrence of a microloading phenomenon and reduce crosstalk by arranging the non-separation region 132 between the pixel 200 not provided with the polarization unit 150 and the pixel 100.

6. Sixth Embodiment

The imaging element 1 of the first embodiment described above is provided with the pixel 100 formed into the rectangular shape in plan view on the incidence surface. In contrast, an imaging element 1 of a sixth embodiment of the present disclosure is different from that in the first embodiment described above in being provided with a pixel 100 in a shape other than a rectangle.

[Configuration of Separation Region]

Figure 12:
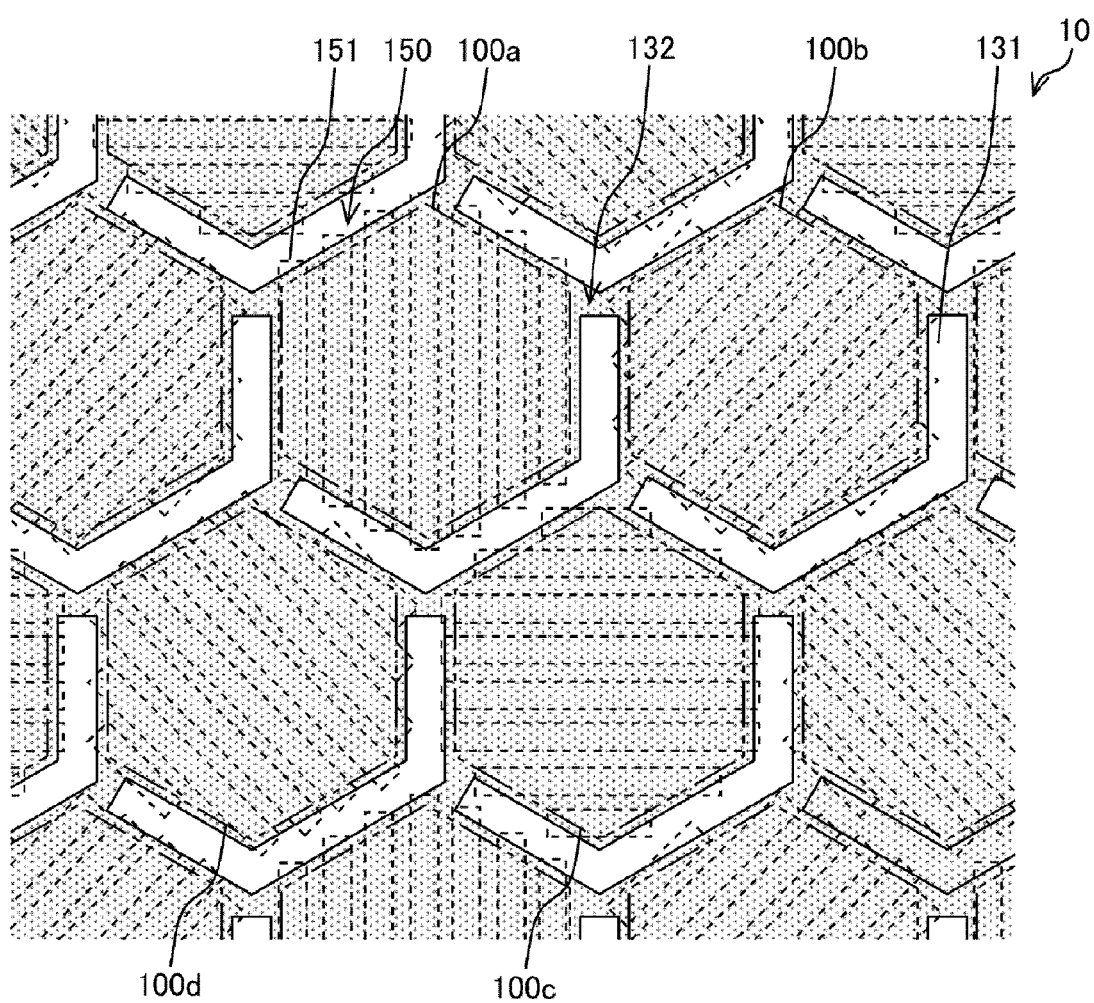
FIG. 12 is a view illustrating a configuration example of a separation region according to a sixth embodiment of the present disclosure.

FIG. 12 is a view illustrating a configuration example of a separation region according to the sixth embodiment of the present disclosure. Similarly to FIG. 3, the drawing is a plan view as seen from incidence surfaces of a plurality of pixels 100 arranged in a pixel array unit 10. This is different from the pixel array unit 10 described with reference to FIG. 3 in being provided with the pixel 100 formed into a hexagonal shape.

Each of pixels 100*a*, 100*b*, 100*c*, and 100*d* in the drawing is formed into the hexagonal shape in plan view of the incidence surface. Similarly to FIG. 3, in the pixels 100*a*, 100*b*, 100*c*, and 100*d*, polarization units 150 of polarization directions different from each other by 45 degrees are arranged, respectively. A separation region 131 is arranged between the pixels 100*a* and the like. Furthermore, in the pixel array unit 10, a non-separation region 132 including a semiconductor substrate 110 in a clearance of the separation region 131 in the vicinity of a corner of the pixel 100*a* and the like is further arranged.

Furthermore, the non-separation region 132 is arranged between the pixels 100*a* and the like provided with the polarization units 150 of polarization directions not orthogonal to each other. Similarly to FIG. 3, this is arranged between the pixel 100*a* and the pixel 100*b*, between the pixel 100*b* and the pixel 100*c*, between the pixel 100*c* and the pixel 100*d*, and between the pixel 100*d* and the pixel 100*a* of the drawing.

Note that, the configuration of the imaging element 1 is not limited to this example. For example, the pixel 100 having another polygonal shape may be arranged.

Since a configuration of the imaging element 1 other than this is similar to the configuration of the imaging element 1 described in the first embodiment of the present disclosure, the description thereof is omitted.

As described above, in a case where the imaging element 1 of the fifth embodiment of the present disclosure is provided with the pixel 100 having the hexagonal shape, by arranging the non-separation region 132 between the pixels 100, occurrence of a microloading phenomenon may be reduced, and crosstalk may be reduced.

7. Application Example to Camera

The technology according to the present disclosure (present technology) may be applied to various products. For example, the present technology may be implemented as an imaging element mounted on an imaging device such as a camera.

Figure 13:
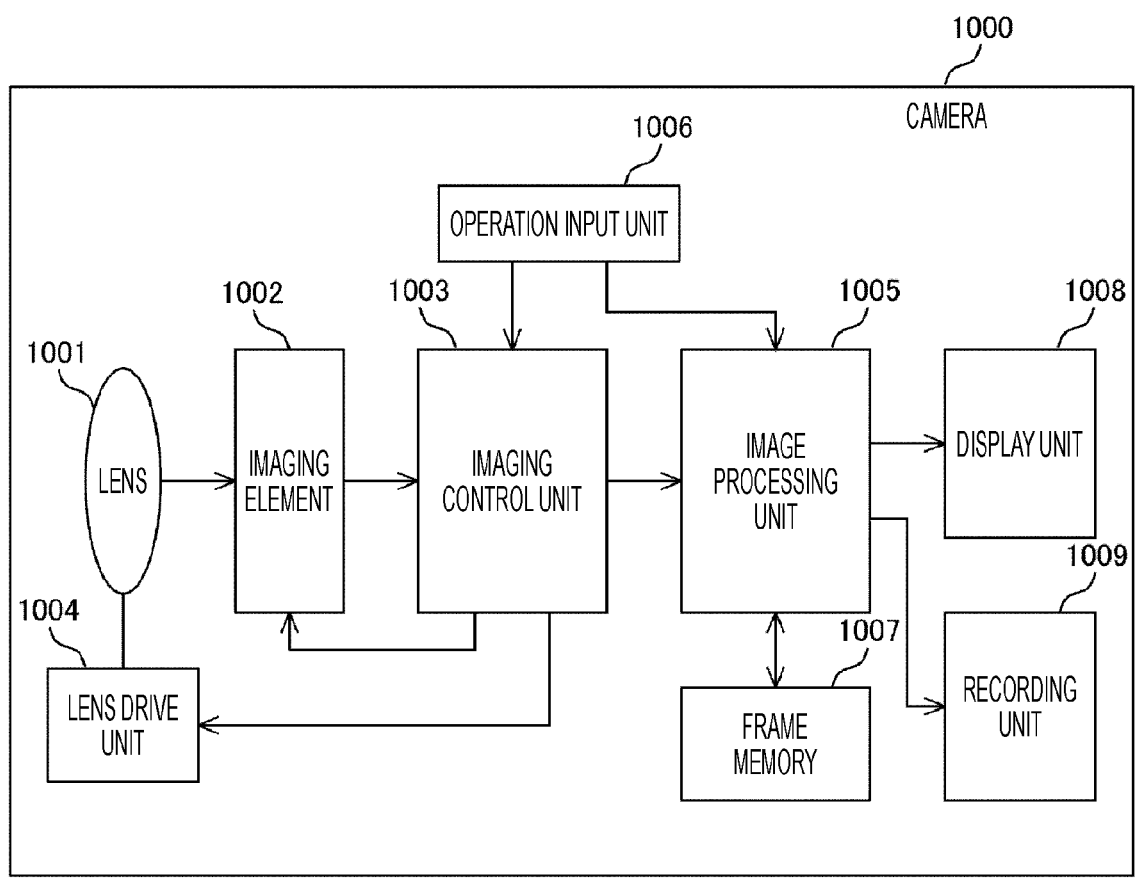
FIG. 13 is a block diagram illustrating a schematic configuration example of a camera, which is an example of an imaging device to which the present technology may be applied.

FIG. 13 is a block diagram illustrating a schematic configuration example of a camera, which is an example of an imaging device to which the present technology may be applied. A camera 1000 in the drawing is provided with a lens 1001, an imaging element 1002, an imaging control unit 1003, a lens drive unit 1004, an image processing unit 1005, an operation input unit 1006, a frame memory 1007, a display unit 1008, and a record unit 1009.

The lens 1001 is an imaging lens of the camera 1000. The lens 1001 condenses light from a subject and allows the same to be incident on the imaging element 1002 to be described later to form an image of the subject.

The imaging element 1002 is a semiconductor element that images the light from the subject condensed by the lens 1001. The imaging element 1002 generates an analog image signal corresponding to applied light and converts the same into a digital image signal to output.

The imaging control unit 1003 controls imaging by the imaging element 1002. The imaging control unit 1003 controls the imaging element 1002 by generating a control signal and outputting the same to the imaging element 1002. Furthermore, the imaging control unit 1003 may perform autofocus in the camera 1000 on the basis of the image signal output from the imaging element 1002. Here, the autofocus is a system that detects a focal position of the lens 1001 to automatically adjust. As the autofocus, a method of detecting the focal position by detecting an image plane phase difference by a phase difference pixel arranged in the imaging element 1002 (image plane phase difference autofocus) may be used. Furthermore, a method of detecting a position in which contrast of an image is the highest as the focal position (contrast autofocus) may also be applied. The imaging control unit 1003 adjusts a position of the lens 1001 via the lens drive unit 1004 on the basis of the detected focal position and performs the autofocus. Note that, the imaging control unit 1003 may include, for example, a digital signal processor (DSP) equipped with firmware.

The lens drive unit 1004 drives the lens 1001 on the basis of control of the imaging control unit 1003. The lens drive unit 1004 may drive the lens 1001 by changing the position of the lens 1001 using a built-in motor.

The image processing unit 1005 processes the image signal generated by the imaging element 1002. This processing includes, for example, demosaicing of generating an image signal of a lacking color among the image signals corresponding to red, green, and blue for each pixel, noise reduction of removing noise of the image signal, encoding of the image signal and the like. The image processing unit 1005 may include, for example, a microcomputer equipped with firmware.

The operation input unit 1006 receives an operation input from a user of the camera 1000. As the operation input unit 1006, for example, a push button or a touch panel may be used. The operation input received by the operation input unit 1006 is transmitted to the imaging control unit 1003 and the image processing unit 1005. Thereafter, processing according to the operation input, for example, processing such as imaging of the subject is started.

The frame memory 1007 is a memory that stores a frame, which is the image signal for one screen. The frame memory 1007 is controlled by the image processing unit 1005 and holds the frame in the course of the image processing.

The display unit 1008 displays an image processed by the image processing unit 1005. As the display unit 1008, for example, a liquid crystal panel may be used.

The record unit 1009 records the image processed by the image processing unit 1005. As the record unit 1009, for example, a memory card or a hard disk may be used.

The camera to which the present disclosure may be applied is described above. The present technology may be applied to the imaging element 1002 among the configurations described above. Specifically, the imaging element 1 illustrated in FIG. 1 may be applied to the imaging element 1002. By applying the imaging element 1 to the imaging element 1002, occurrence of crosstalk is reduced, and deterioration in image quality of the image generated by the camera 1000 may be prevented. Note that, the image processing unit 1005 is an example of a processing circuit recited in claims. The camera 1000 is an example of an imaging device recited in claims.

Note that, the camera is herein described as an example, but the technology according to the present disclosure may be applied to, for example, a monitoring device and the like in addition to this. Furthermore, the present disclosure may be applied to a semiconductor device in a form of a semiconductor module in addition to an electronic device such as a camera. Specifically, the technology according to the present disclosure may be applied to an imaging module, which is a semiconductor module in which the imaging element 1002 and the imaging control unit 1003 in FIG. 13 are enclosed in one package.

Finally, the description of each of the above-described embodiments is an example of the present disclosure, and the present disclosure is not limited to the above-described embodiments. For this reason, it goes without saying that various changes may be made according to a design and the like without departing from the technical idea according to the present disclosure in addition to the respective embodiments described above.

Furthermore, the drawings in the above-described embodiments are schematic, and dimensional ratios and the like of the respective units do not necessarily coincide with actual ones. Furthermore, it goes without saying that dimensional relationships and ratios are partly different between the drawings.

Note that the present technology may also have a following configuration.

(1) An imaging element provided with:
a plurality of pixels each provided with a polarization unit that polarizes incident light in a specific polarization direction and a photoelectric conversion unit that is formed in a semiconductor substrate and performs photoelectric conversion of the polarized incident light;

a separation region that is arranged in the semiconductor substrate and separates the plurality of pixels from each other; and a non-separation region including the semiconductor substrate in a clearance formed in the separation region in the vicinity of a corner of the pixels.

(2) The imaging element according to (1) described above, in which the polarization unit polarizes the incident light by transmitting incident light in a specific polarization direction out of the incident light.

(3) The imaging element according to (2) described above, in which the polarization unit includes a wire grid including a plurality of strip-shaped conductors arranged at a predetermined pitch.

(4) The imaging element according to any one of (1) to (3) described above, in which the non-separation region is arranged between the plurality of pixels provided with polarization units of specific polarization directions not orthogonal to each other.

(5) The imaging element according to any one of (1) to (4) described above, in which the separation region is formed in a recess formed in the semiconductor substrate.

(6) The imaging element according to any one of (1) to (5) described above, in which the separation region includes a member that shields the incident light.

(7) The imaging element according to (6) described above, in which the separation region includes a member of metal.

(8) The imaging element according to any one of (1) to (5) described above, in which the separation region includes an insulating member.

(9) The imaging element according to any one of (1) to (8) described above, in which the non-separation region includes the semiconductor substrate in the clearance having a gap of approximately 10% of a width of a surface irradiated with the incident light of the pixel.

(10) The imaging element according to any one of (1) to (8) described above, in which the non-separation region includes the semiconductor substrate in the clearance having a gap substantially equivalent to a width of a surface irradiated with the incident light of the separation region.

(11) The imaging element according to any one of (1) to (10) described above, further provided with: a second pixel that is the pixel not provided with the polarization unit.

(12) The imaging element according to (11) described above, in which the non-separation region is arranged between the pixel and the second pixel.

(13) An imaging device provided with:

a plurality of pixels each provided with a polarization unit that polarizes incident light in a specific polarization direction and a photoelectric conversion unit that is formed in a semiconductor substrate and performs photoelectric conversion of the polarized incident light;

a separation region that is arranged in the semiconductor substrate and separates the plurality of pixels from each other;

a non-separation region including the semiconductor substrate in a clearance formed in the separation region in the vicinity of a corner of the pixels; and a processing circuit that processes an image signal generated on the basis of the photoelectric conversion.

REFERENCE SIGNS LIST

1 Imaging element
10 Pixel array unit
20 Column signal processing unit
100, 100a, 100b, 100c, 100d, 200 Pixel
101 Photoelectric conversion unit
110 Semiconductor substrate
130 Recess
131 Separation region
132 Non-separation region
150 Polarization unit
151 Strip-shaped conductor
1000 Camera
1002 Imaging element
1005 Image processing unit

The invention claimed is:

1. An imaging element, comprising:
a plurality of pixels, wherein each pixel of the plurality of pixels includes a polarization unit and a photoelectric conversion unit in a semiconductor substrate, wherein
the polarization unit is configured to polarize incident light in a specific polarization direction, and
the photoelectric conversion unit is configured to perform photoelectric conversion of the polarized incident light;
a plurality of separation regions in the semiconductor substrate, wherein the plurality of separation regions is configured to separate the plurality of pixels; and
a non-separation region in the semiconductor substrate and adjacent to an intersection of a set of separation regions of the plurality of separation regions.

2. The imaging element according to claim 1, wherein the polarization unit is further configured to polarize the incident light based on a transmission of the incident light in the specific polarization direction.

3. The imaging element according to claim 2, wherein the polarization unit includes a wire grid including a plurality of strip-shaped conductors at a specific pitch.

4. The imaging element according to claim 1, wherein the non-separation region is between the plurality of pixels with the polarization unit of non-orthogonal polarization direction.

5. The imaging element according to claim 1, wherein each of the plurality of separation regions is in a recess in the semiconductor substrate.

6. The imaging element according to claim 1, wherein each of the plurality of separation regions includes a member, wherein the member is configured to shield the incident light.

7. The imaging element according to claim 6, wherein the member includes a metal.

8. The imaging element according to claim 1, wherein each of the plurality of separation regions includes an insulating member.

9. The imaging element according to claim 1, wherein the non-separation region has a gap of substantially 10% of a width of a surface irradiated with the incident light.

10. The imaging element according to claim 1, wherein the non-separation region has a gap substantially equivalent to a width of each of the set of separation regions.

11. The imaging element according to claim 1, further comprising: a second pixel that is without the polarization unit.

12. The imaging element according to claim 11, wherein the non-separation region is between a pixel with the polarization unit and the second pixel, and wherein the plurality of pixels includes the pixel.

13. An imaging device, comprising:
a plurality of pixels, wherein each pixel of the plurality of pixels includes a polarization unit and a photoelectric conversion unit in a semiconductor substrate, wherein the polarization unit is configured to polarize incident light in a specific polarization direction, and the photoelectric conversion unit is configured to perform photoelectric conversion of the polarized incident light;

a plurality of separation regions in the semiconductor substrate, wherein the plurality of separation regions is configured to separate the plurality of pixels;

a non-separation region in the semiconductor substrate and adjacent to an intersection of a set of separation regions of the plurality of separation regions; and a processing circuit configured to process an image signal, wherein generation of the image signal is based on the photoelectric conversion.

* * * * *